(12) United States Patent
Hsu et al.

(10) Patent No.: US 9,230,912 B2
(45) Date of Patent: Jan. 5, 2016

(54) METHOD FOR MANUFACTURING SEMICONDUCTOR DEVICE AND DEVICE MANUFACTURED USING THE SAME

(71) Applicant: UNITED MICROELECTRONICS CORP., Hsinchu (TW)

(72) Inventors: Hsin-Kuo Hsu, Kaohsiung (TW); Li-Chieh Hsu, Taichung (TW); Hsiang-Hao Chen, New Taipei (TW); Chung-Wei Hsueh, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 5 days.

(21) Appl. No.: 14/279,602

(22) Filed: May 16, 2014

(65) Prior Publication Data

US 2015/0333000 A1  Nov. 19, 2015

(51) Int. Cl.
| | |
|---|---|
| *H01L 21/311* | (2006.01) |
| *H01L 23/528* | (2006.01) |
| *H01L 23/532* | (2006.01) |
| *H01L 21/768* | (2006.01) |
| *H01L 21/3213* | (2006.01) |
| *H01L 21/321* | (2006.01) |

(52) U.S. Cl.
CPC .......... *H01L 23/528* (2013.01); *H01L 21/3212* (2013.01); *H01L 21/32134* (2013.01); *H01L 21/7684* (2013.01); *H01L 21/7685* (2013.01); *H01L 21/76843* (2013.01); *H01L 21/76877* (2013.01); *H01L 23/53238* (2013.01)

(58) Field of Classification Search
CPC ............ H01L 21/3212; H01L 21/3105; H01L 21/762; H01L 21/02332; H01L 21/02175; H01L 21/2807; H01L 21/76224; H01L 21/76205; H01L 21/76872; H01L 21/76831; H01L 21/76202; H01L 23/53233; H01L 23/3736
USPC ......... 438/700, 692, 589, 592, 523, 672, 353, 438/691, 759, 769, 376; 257/396, 503, 622, 257/E21.006, E21.126, E21.127, E21.23, 257/E21.267, E21.304, E21.545, E21.546, 257/E21.547, E21.548, E21.549
See application file for complete search history.

(56) References Cited

U.S. PATENT DOCUMENTS

| | | | | |
|---|---|---|---|---|
| 6,921,551 | B2 * | 7/2005 | Basol ........................... | 427/97.1 |
| 6,956,289 | B2 * | 10/2005 | Kunikiyo ...................... | 257/758 |
| 8,158,532 | B2 * | 4/2012 | Mayer et al. .................. | 438/754 |
| 8,314,494 | B2 | 11/2012 | Nopper et al. | |
| 8,440,564 | B2 * | 5/2013 | Yu et al. ........................ | 438/653 |

* cited by examiner

*Primary Examiner* — David Nhu
(74) *Attorney, Agent, or Firm* — WAPT, PC; Justin King

(57) ABSTRACT

A method for manufacturing a semiconductor device and a device manufactured using the same are provided. According to the embodiment, substrate with a dielectric layer formed thereon is provided. Plural trenches are defined in the dielectric layer, and the trenches are isolated by the dielectric layer. A first barrier layer is formed in the trenches as barrier liners of the trenches, followed by filling the trenches with a conductor. Then, the conductor in the trenches is partially removed to form a plurality of recesses, wherein remained conductor has a flat surface. Next, a second barrier layer is formed in the recesses as barrier caps of the trenches.

21 Claims, 5 Drawing Sheets

METHOD FOR MANUFACTURING SEMICONDUCTOR DEVICE AND DEVICE MANUFACTURED USING THE SAME

BACKGROUND

1. Technical Field

The disclosure relates in general to a method for manufacturing a semiconductor device and device manufactured using the same, and more particularly to the method for manufacturing a semiconductor device by forming barriers for improving the electrical characteristics of the semiconductor device.

2. Description of the Related Art

Size of semiconductor device has been decreased for these years. Reduction of feature size, improvements of the rate, the efficiency, the density and the cost per integrated circuit unit are the important goals in the semiconductor technology. The electrical properties of the device have to be maintained even improved with the decrease of the size, to meet the requirements of the commercial products in applications. For example, the layers and components with damages, which have considerable effects on the electrical properties, would be one of the important issues of the device for the manufacturers.

Generally, a semiconductor device with good electrical performance requires the conductive lines with complete profiles and stacking layers with great evenness. Unwanted conductive bridges forming between the conductive lines would lead to the device failure. Accordingly, it is desirable to develop a method for forming the conductive lines with complete profiles and flat surfaces, so that solves the problem of unwanted conductive bridge and improves the electrical characteristics of the device.

SUMMARY

The disclosure is directed to a method for manufacturing a semiconductor device and device manufactured using the same, which forms the conductive lines with smooth and flat surfaces, thereby improving the electrical characteristics of the semiconductor device.

According to the disclosure, a method for manufacturing a semiconductor device is disclosed. A substrate with a dielectric layer formed thereon is provided. Plural trenches are defined in the dielectric layer, and the trenches are isolated by the dielectric layer. A first barrier layer is formed in the trenches as barrier liners of the trenches, followed by filling the trenches with a conductor. Then, the conductor in the trenches is partially removed to form a plurality of recesses, wherein remained conductor has a flat surface. Next, a second barrier layer is formed in the recesses as barrier caps of the trenches. In the embodiment, a top surface of the remained conductor is lower than a top surface of the dielectric layer and a top surface of the first barrier layer.

According to the disclosure, a semiconductor device is provided, comprising a dielectric layer formed on a substrate, and a plurality of conductive lines formed in the dielectric layer, and the conductive lines are isolated by the dielectric layer. One of the conductive lines comprises a trench formed in the dielectric layer, a first barrier layer formed in the trench as a barrier liner of the trench, a conductor having a flat top surface, and a second barrier layer. The trench is partially filled with the conductor to form a recess, and the second barrier layer is formed in the recess as a barrier cap on the conductor.

DETAILED DESCRIPTION

In the embodiment of the present disclosure, a method for manufacturing a semiconductor device is disclosed. According to the embodiment, the manufacturing method including forming recess in the conductive trench (i.e. the trench filled with conductor such as Cu) and filling an additional barrier in the recess is provided, wherein the surface of the conductor in the recess is extremely flat, thereby providing excellent adhesion between the conductor and the additional barrier formed thereon. Accordingly, the electrical properties of the semiconductor device as manufactured by the method of the embodiment can be greatly improved, such as increasing the breakdown voltage of the device and solving the conventional problem of conductive bridges occurred undesirably to connect adjacent trenches.

Embodiments are provided hereinafter with reference to the accompanying drawings for describing the related configurations and procedures, but the present disclosure is not limited thereto. It is noted that not all embodiments of the invention are shown. Modifications and variations can be made without departing from the spirit of the disclosure to meet the requirements of the practical applications. Thus, there may be other embodiments of the present disclosure which are not specifically illustrated.

It is also important to point out that the illustrations may not be necessarily be drawn to scale. Thus, the specification and the drawings are to be regard as an illustrative sense rather than a restrictive sense.

Figure 1A:
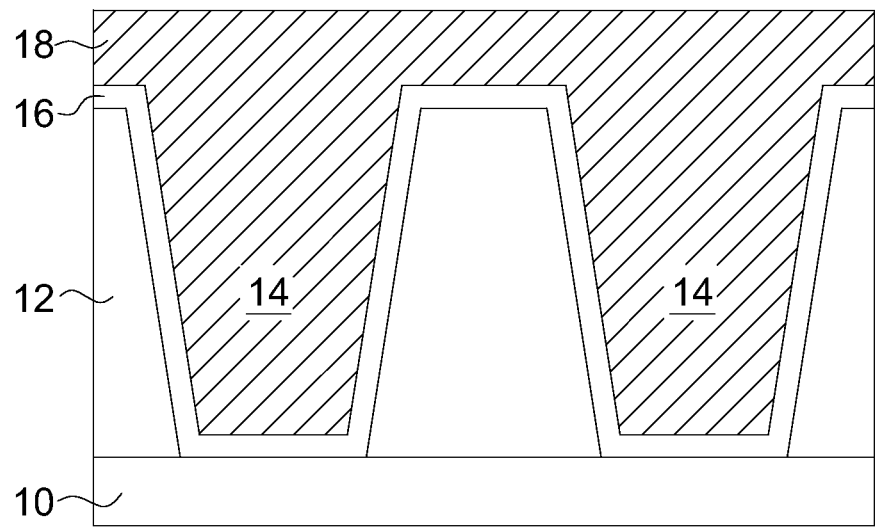
FIG. 1A~FIG. 1E illustrate a method for manufacturing a semiconductor device according to one embodiment of the present disclosure.

FIG. 1A~FIG. 1E illustrate a method for manufacturing a semiconductor device according to one embodiment of the present disclosure. In the embodiment, a substrate 10 and a dielectric layer 12 formed on the substrate 10 is provided. In one embodiment, the dielectric layer 12 comprises an ultra-low k dielectric material. A plurality of trenches 14 are defined and formed in the dielectric layer 12, and the trenches 14 are isolated by the dielectric layer 12, as shown in FIG. 1 A. Also, a first barrier layer 16 is formed in the trenches as barrier liners of the trenches 14, and a conducive material layer 18 is formed on the first barrier layer 16 and filling up the trenches 14, as shown in FIG. 1A.

Figure 1B:
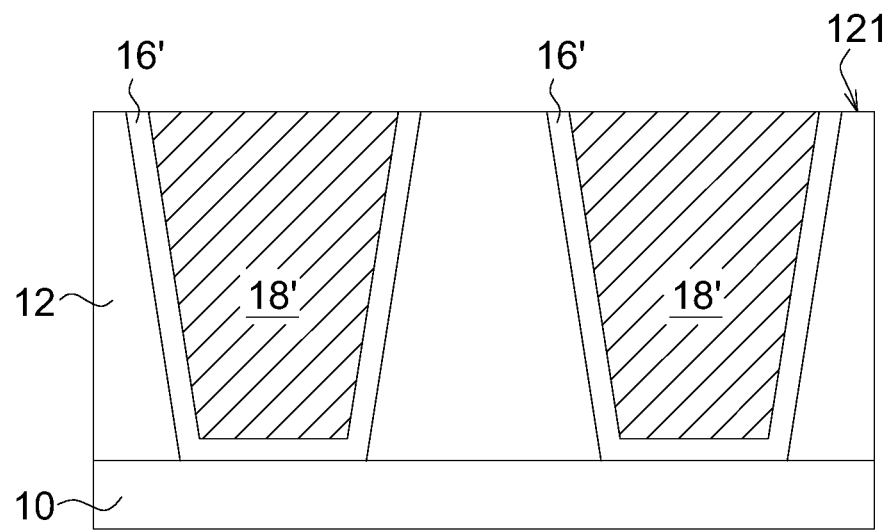
Figure 1C:
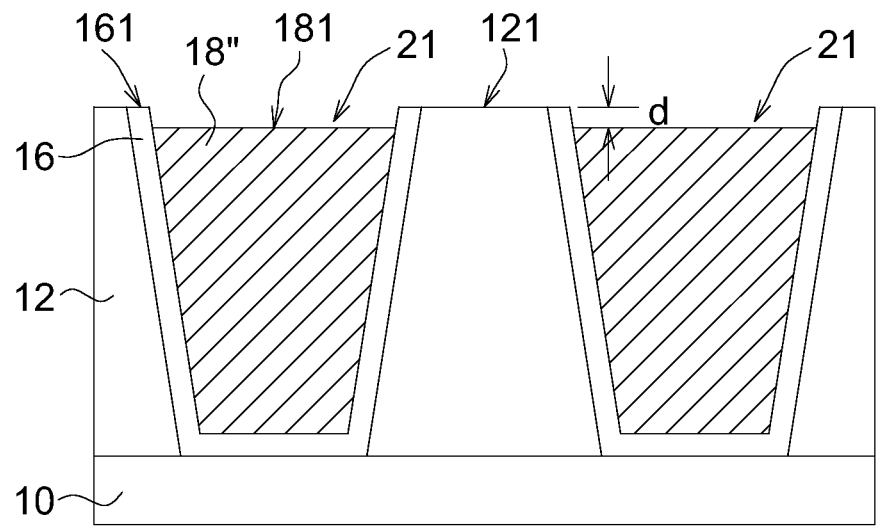

The structure of FIG. 1A is then polished, such as by chemical mechanical polishing (CMP), to remove the portions of the conducive material layer 18 and the first barrier layer 16 above the dielectric layer 12, thereby forming the trenches 14 filled with the conductor 18', as shown in FIG. 1B. Meanwhile, the top surfaces 181 of the conductors 18' are substantially aligned with the top surface 121 of the dielectric layer 12.

Afterward, the conductors 18' in the trenches 14 are partially removed to form a plurality of recesses 21, and the remained conductor 18" in the trenches 14 has flat surface, as shown in FIG. 10. It is depicted in in FIG. 10 that the top surface 181 of the remained conductor 18" is lower than the top surface 121 of the dielectric layer 12 and the top surface 161 of the first barrier layer 16'.

According to the embodiment, a chemical solution can be applied for forming the recesses 21. In one embodiment, the conductor 18' in the trenches 14 can be partially removed by applying a chemical buff (i.e. a chemical solution) comprising tetramethylammonium hydroxide, an amino alcohol or derivative thereof. In one embodiment, the chemical buff comprises quaternary ammonia derivative, substituted tertiary amine, 2-(2-aminoethylamino)ethanol, 2-(dimethylamino)ethanol, aliphatic dicarboxylic acid, and glycolic acid.

In one application, the conductor 18' comprises copper (Cu), and the Cu etching rate is larger than 0.1 A/min. The etching time depends on the target depth of recesses 21 and the pre-determined etching conditions such as concentration of chemical buff, down force and etching rate. In one embodiment, a diluted ratio of the chemical buff is in a range of about 1:1 to 1:1000. In one embodiment, a depth (d) of the recesses 21 is in a range of about 10 Å~200 Å. In one embodiment, a depth (d) of the recesses 21 is about 20 | or more. In one embodiment, a depth (d) of the recesses 21 is in a range of about 20 Å~100 Å. In one embodiment, the trenches 14 with the conductor 18' as shown in FIG. 1B are subjected to the chemical buff under no pressure or a low pressure, such as a pressure no more than 5 psi. In one embodiment, the trenches 14 with the conductor 18' are subjected to the chemical buff under a pressure of 0~5 psi, or 0 hpa~350 hpa. It is noted that those contents the chemical buff and the etching conditions are demonstrated only for exemplifying some applications, not for limiting the scope of the claimed invention.

As depicted in FIG. 1O, the top surface 181 of the remained conductor 18" is substantially parallel to the top surface 121 of the dielectric layer 12, and there is no rounding corner shown in the boundary between the remained conductor 18" and the first barrier layer 16'. According to the method of the embodiment, the remained conductor 18" in the trenches 14 possesses the flat top surface 181 and an extremely low surface roughness. In one embodiment, the flat top surface 181 of the remained conductor 18" has a surface roughness no more than 20 Å.

Figure 1D:
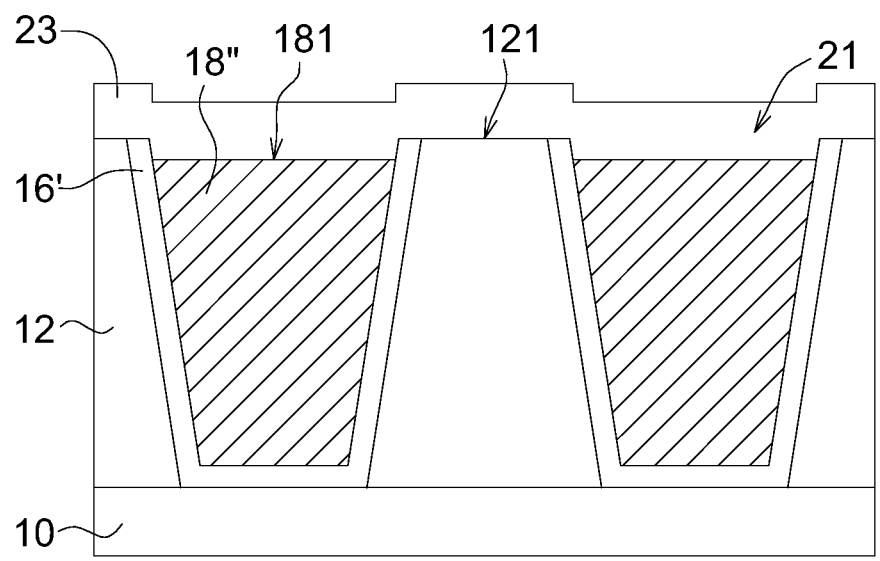
Figure 1E:
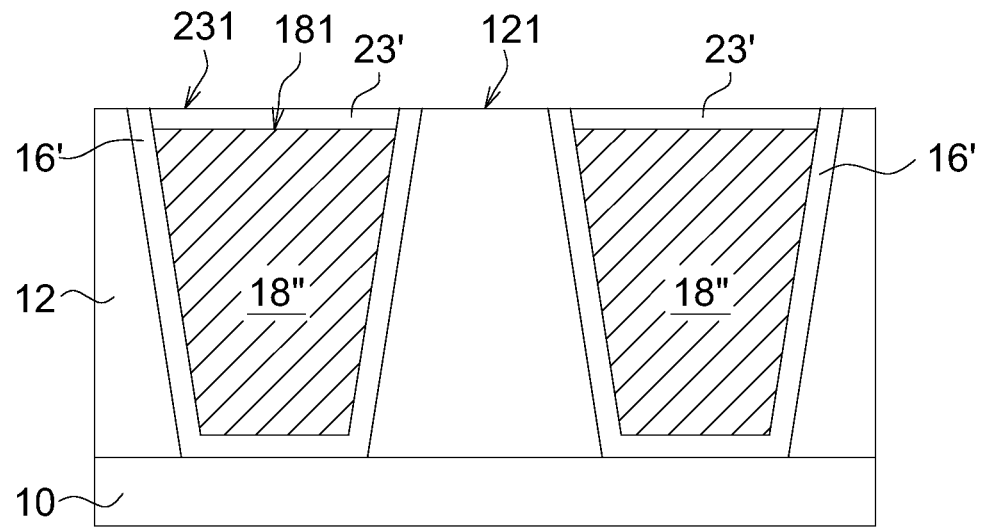

Next, an additional barrier layer is formed in the recesses 21 as the barrier caps of the trenches 14. In one embodiment, a second barrier layer 23 is formed on the trenches 14 and the dielectric layer 12 as a capping layer, as shown in FIG. 1D. The second barrier layer 23 is then polished such as by CMP until reaching the top surface 121 of the dielectric layer 12, as shown in FIG. 1E. As depicted in FIG. 1E, the top surface 181 of the remained conductor 18" is substantially parallel to the top surface 231 of the second barrier layer 23'.

Also, the first barrier layer 16/16' and the second barrier layer 23/23' may comprise the same material or different materials. According to one embodiment, the first barrier layer 16/16' and the second barrier layer 23/23' independently selected from the group consisting of Ti, TiN, Ta, TaN, CoP, CoB, CoWP, CoWB, NiWP, CoSnP, NiWB, CuSi, ZrN, NiMoP, and combinations thereof. In one embodiment, the first barrier layer 16/16' and the second barrier layer 23/23' comprise a multi-layer of Ta/TaN. The first barrier layer 16/16' and the second barrier layer 23/23' comprising the same material do effectively prevent Gavanic corrosion.

It is noted that the step details and material selections of the embodied methods would be slightly different, and can be modified and changed depending on the types and actual needs of the practical applications. The illustrated details herein are for describing the embodiment only, not for limiting the claimed scope of the present disclosure.

A semiconductor device of one embodiment, as shown in FIG. 1E, comprises the a dielectric layer 12 formed on the substrate 10, and a plurality of conductive lines formed in the dielectric layer 12, and the conductive lines are isolated by the dielectric layer 12. In one embodiment, one of the conductive lines comprises a trench 14 formed in the dielectric layer 12, a first barrier layer 16' formed in the trench 14 as a barrier liner of the trench 14, a conductor 18" having a flat top surface 181, and a second barrier layer 23'. The trench 14 is partially filled with the conductor 18", and the second barrier layer 23' is formed in the recess 21 as a barrier cap on the conductor 18". According to the embodiment, the flat top surface 181 of the conductor 18" is lower than the top surface 121 of the dielectric layer 12 and the top surface 161 of the first barrier layer 16'. In other words, the remained conductor 18" in the trench 14 of the embodiment is capped by the second barrier layer 23', and the top surface 161 of the first barrier layer 16' is substantially aligned with the top surface 231 of the second barrier layer 23'. Accordingly, each of conductive lines comprises three portions, which are the conductor 18" enclosed by the first barrier layer 16' and the second barrier layer 23'. Also, the conductive lines manufactured by the embodied method possess smooth and flat surface.

In the conventional method, a conductive layer such as a Cu layer formed on the dielectric layer and filling the trench is polished by CMP, and the Cu surfaces in the trenches are typically rough and not flat. Also, the rounding corner may be shown in the boundary between the conductive line (such as Cu-line) and the first barrier. According to the embodiment, the TEM result of the embodied structure clearly shows that the flat top surface 181 of the conductor 18" is substantially parallel to the top surface 231 of the second barrier layer 23', and no rounding corner is formed at the boundary between the conductor 18" and the first barrier layer 16'. Also, the TEM result shows that the top surface 181 of the conductor 18" is flat with extremely low surface roughness, thereby providing good adhesion for the conductor 18" and the second barrier layer 23' subsequently formed thereon.

Figure 2A:
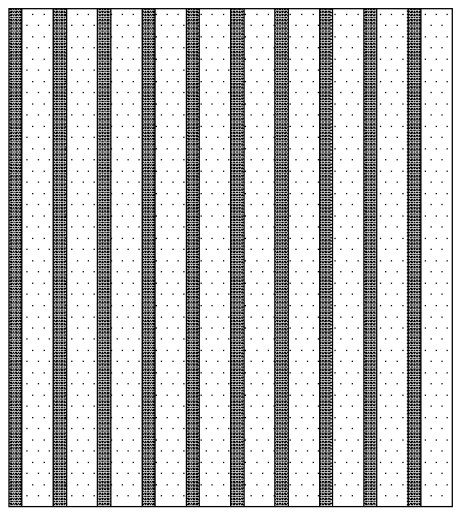
FIG. 2A and FIG. 2B schematically show the top views of the conductive lines of the semiconductor devices manufactured by the embodiment of the method and by the conventional method, respectively.
Figure 2B:
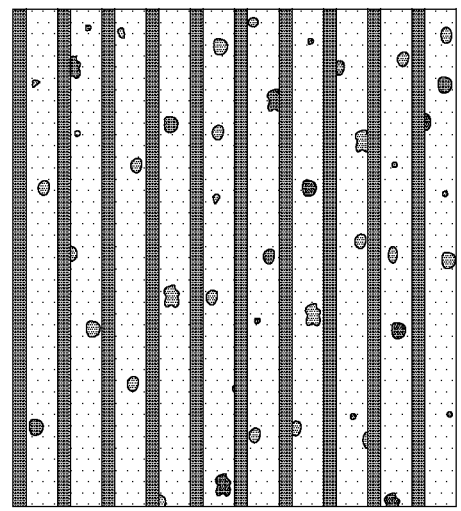

FIG. 2A and FIG. 2B schematically show the top views of the conductive lines of the semiconductor devices manufactured by the embodiment of the method and by the conventional method, respectively. Compared to the conventional device having rough conductive surfaces (FIG. 2B), the conductive lines manufactured by the embodiment possess flat top surface with extremely low surface roughness (FIG. 2A).

Figure 3:
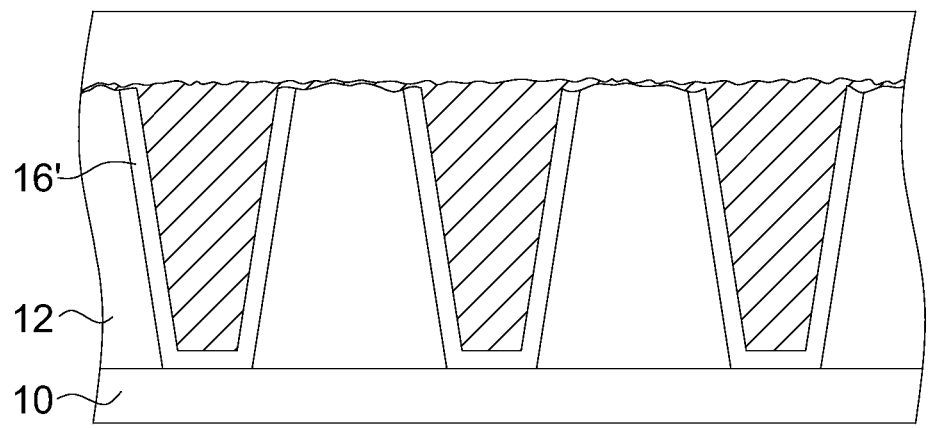
FIG. 3 illustrates the unwanted conductive bridges (such as Cu-bridges) generated in the typical manufacturing process after voltage supply.

Also, the rough surfaces of the conductive line (such as Cu-line) would lead to device failure due to the formation of unwanted Cu-bridges after voltage supply. FIG. 3 illustrates the unwanted conductive bridges (such as Cu-bridges) generated in the typical manufacturing process after voltage supply, and the adjacent trenches are undesirably connected, thereby causing the failure of the device.

Figure 4:
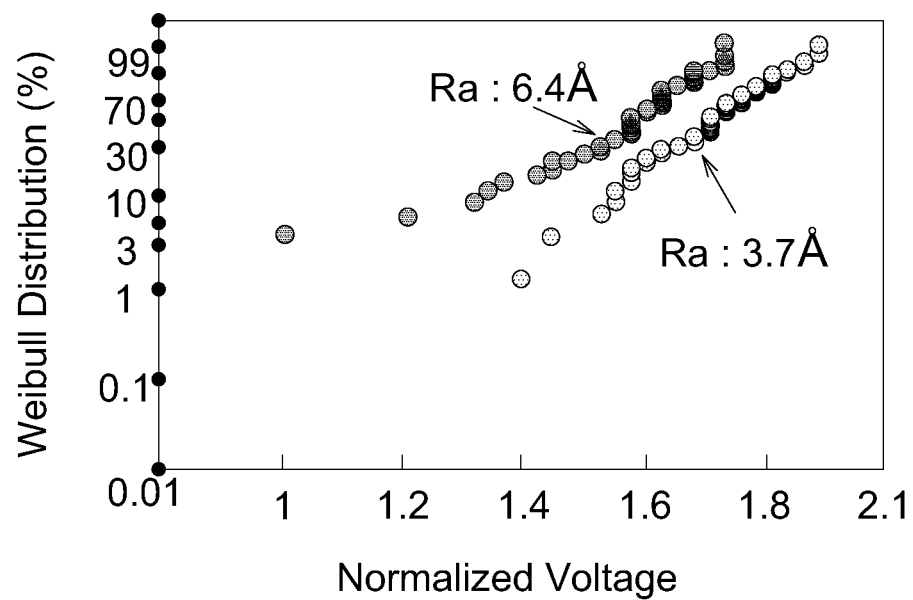
FIG. 4 shows TDDB performances of the conductive lines with different surface roughness.

Furthermore, the rough surfaces of the conductive line (such as Cu-line) would decrease the breakdown voltage. FIG. 4 shows TDDB (time-dependent dielectric breakdown, which is a reliability test) performances of the conductive lines with different surface roughness. In FIG. 4, the conductive line with a surface roughness (Ra) of about 6.4 Å has about 1.7 of breakdown voltage (normalized voltage), while the conductive line with a surface roughness (Ra) of about 3.7 Å has about 1.9 of breakdown voltage (normalized voltage). Thus, the results indicated that TDDB performance is strongly correlated to the surface roughness of the conductive line. The smoother the surface of the conductive line (small value of surface roughness), the higher the breakdown voltage.

According to the embodiment, since the remained conductor 18" in the trench 14 is enclosed by the first barrier layer 16' and the second barrier layer 23' (as shown in FIG. 1E), and good adhesion exists between the conductor 18" and the second barrier layer 23' (due to the flat top surface 181 of the remained conductor 18"), the electrical properties of the semiconductor device as manufactured by the method of the embodiment can be greatly improved, such as increasing the breakdown voltage of the device and effectively preventing occurrence of the undesirable conductive bridges which typically generated for connecting adjacent trenches in the convention manufacturing process after voltage supply.

Other embodiments with different configurations of gates are also applicable, which could be varied depending on the actual needs of the applications. It is, of course, noted that the configurations of FIG. 1A~FIG. 1E are depicted only for demonstration, not for limitation. It is known by people skilled in the art that the shapes or positional relationship of the constituting elements could be adjusted according to the structural requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor device, comprising:
   providing a substrate and a dielectric layer formed on the substrate;
   defining a plurality of trenches in the dielectric layer, and the plurality of trenches being isolated by the dielectric layer;
   forming a first barrier layer in the plurality of trenches as barrier liners of the Plurality of trenches;
   filling the plurality of trenches with a conductor;
   partially removing the conductor in the plurality of trenches to form a plurality of recesses, wherein remained conductor has a flat surface and said flat surface of the remained conductor has a surface roughness no more than 20Å; and
   forming a second barrier layer in the plurality of recesses as barrier caps of the plurality of trenches.

2. The method according to claim 1, wherein the conductor in the conductor in the plurality of trenches is partially removed by applying a chemical buff comprising tetramethylammonium hydroxide, and an amino alcohol or a derivative of amino alcohol.

3. The method according to claim 2, wherein the plurality of trenches with the conductor are subjected to the chemical buff under a pressure no more than 5 psi.

4. The method according to claim 1, wherein a top surface of the remained conductor is parallel to a top surface of the second barrier layer.

5. The method according to claim 1, wherein said flat surface of the remained conductor is lower than a top surface of the dielectric layer and a top surface of the first barrier layer.

6. The method according to claim 5, wherein the remained conductor in each of the plurality of trenches is capped by the second barrier layer, and the top surface of the first barrier layer is substantially aligned with a top surface of the second barrier layer.

7. The method according to claim 5, wherein the remained conductor in each of the plurality of trenches is enclosed by the first barrier layer and the second barrier layer.

8. The method according to claim 1, wherein a depth of the plurality of recesses is in a range of about 10Å~200Å.

9. The method according to claim 1, wherein a depth of the plurality of recesses is in a range of about 20Å~100Å.

10. The method according to claim 1, wherein step of forming the second barrier in the plurality of recesses comprises:
    capping the second barrier layer on the plurality of trenches and the dielectric layer; and
    polishing the second barrier layer until reaching a top surface of the dielectric layer.

11. The method according to claim 1, wherein the first and the second barrier layers comprise the same material.

12. The method according to claim 1, wherein the dielectric layer comprises an ultra-low k dielectric material.

13. A semiconductor device, comprising:
    a dielectric layer formed on a substrate; and
    a plurality of conductive lines formed in the dielectric layer, and the plurality of conductive lines isolated by the dielectric layer, one of the plurality of conductive lines comprising:
      a trench formed in the dielectric layer;
      a first barrier layer formed in the trench as a barrier liner of the trench;
      a conductor having a flat top surface, and the trench being partially filled with the conductor to form a recess, wherein the flat top surface of the conductor has a surface roughness no more than 20Å; and
      a second barrier layer formed in the recess as a barrier cap on the conductor.

14. The semiconductor device according to claim 13, wherein the flat top surface of the conductor is parallel to a top surface of the second barrier layer.

15. The semiconductor device according to claim 13, wherein the flat top surface of the conductor is lower than a top surface of the dielectric layer and a top surface of the first barrier layer.

16. The semiconductor device according to claim 15, wherein the top surface of the first barrier layer is substantially aligned with a top surface of the second barrier layer.

17. The semiconductor device according to claim 15, wherein the conductor in the trench is enclosed by the first barrier layer and the second barrier layer.

18. The semiconductor device according to claim 13, wherein a depth of the plurality of recesses is in a range of about 10Å~200Å.

19. The semiconductor device according to claim 13, wherein a depth of the plurality of recesses is in a range of about 20Å~100Å.

20. The semiconductor device according to claim 13, wherein the first and the second barrier layers comprise the same material.

21. The semiconductor device according to claim 13, wherein the dielectric layer comprises an ultra-low k dielectric material.

* * * * *